United States Patent
Zhang

(10) Patent No.: US 9,748,973 B2
(45) Date of Patent: Aug. 29, 2017

(54) INTERLEAVED LAYERED DECODER FOR LOW-DENSITY PARITY CHECK CODES

(71) Applicant: SANDISK ENTERPRISE IP LLC, Dallas, TX (US)

(72) Inventor: Xinmiao Zhang, Seattle, WA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/258,843

(22) Filed: Apr. 22, 2014

(65) Prior Publication Data

US 2015/0303942 A1    Oct. 22, 2015

(51) Int. Cl.
*H03M 13/11* (2006.01)
*H03M 13/27* (2006.01)
*G06F 11/10* (2006.01)

(52) U.S. Cl.
CPC ..... *H03M 13/1105* (2013.01); *G06F 11/1076* (2013.01); *H03M 13/114* (2013.01); *H03M 13/1117* (2013.01); *H03M 13/1171* (2013.01); *H03M 13/27* (2013.01)

(58) Field of Classification Search
CPC .................................................. H03M 13/11
USPC ........................................ 714/752, 758, 773
See application file for complete search history.

(56) References Cited

U.S. PATENT DOCUMENTS

| 7,990,290 | B1 | 8/2011 | Jagmohan et al. |
|---|---|---|---|
| 8,418,023 | B2 | 4/2013 | Gunnam et al. |
| 8,443,271 | B1 | 5/2013 | Zhang et al. |
| 8,516,347 | B1 | 8/2013 | Li et al. |
| 8,667,361 | B1 | 3/2014 | Varnica et al. |
| 8,751,889 | B2 | 6/2014 | Zhang et al. |
| 8,751,912 | B1 | 6/2014 | Varnica et al. |
| 8,880,973 | B1 | 11/2014 | Li et al. |
| 8,938,660 | B1 | 1/2015 | Varnica et al. |
| 8,996,969 | B2 * | 3/2015 | Bolotov ............. H03M 13/1111 714/752 |
| 9,059,746 | B2 | 6/2015 | Dixon et al. |
| 9,153,331 | B2 * | 10/2015 | D'Abreu ................ G11C 16/16 |
| 2003/0033575 | A1 | 2/2003 | Richardson et al. |
| 2004/0081073 | A1 * | 4/2004 | Walton ................. H04B 7/0669 370/204 |
| 2004/0252791 | A1 | 12/2004 | Shen et al. |
| 2004/0255228 | A1 | 12/2004 | Shen et al. |
| 2004/0255231 | A1 | 12/2004 | Shen et al. |
| 2004/0258177 | A1 | 12/2004 | Shen et al. |
| 2005/0028071 | A1 | 2/2005 | Shen et al. |
| 2005/0193320 | A1 | 9/2005 | Varnica et al. |
| 2005/0229090 | A1 | 10/2005 | Shen et al. |

(Continued)

OTHER PUBLICATIONS

Ardakani, Masoud "Efficient Analysis, Design and Decoding of Low-Density Parity-Check Codes," Doctoral Dissertation, http://www.ece.ualberta.ca/~ardakani/Ardakan_thesis.pdf, 2004, 164 pages.

(Continued)

*Primary Examiner* — Fritz Alphonse
(74) *Attorney, Agent, or Firm* — Toler Law Group, PC

(57) ABSTRACT

A controller is configured to access information to generate data blocks. The controller includes a data block interleaver and a low-density parity check (LDPC) decoder. The data block interleaver is configured to interleave the data blocks to generate interleaved data blocks. The LDPC decoder is configured to decode the interleaved data blocks.

20 Claims, 4 Drawing Sheets

(56) References Cited

U.S. PATENT DOCUMENTS

| | | |
|---|---|---|
| 2005/0268206 A1 | 12/2005 | Tran et al. |
| 2005/0283707 A1 | 12/2005 | Sharon et al. |
| 2006/0020870 A1 | 1/2006 | Hocevar |
| 2006/0039196 A1* | 2/2006 | Gorobets ............... G06F 11/106 365/185.01 |
| 2006/0150055 A1* | 7/2006 | Quinard ................ H04L 1/0009 714/752 |
| 2007/0245214 A1* | 10/2007 | Ramamoorthy .... G06F 11/1072 714/758 |
| 2008/0028282 A1 | 1/2008 | Zhong et al. |
| 2009/0282319 A1 | 11/2009 | No et al. |
| 2010/0017676 A1 | 1/2010 | Gross et al. |
| 2010/0042903 A1 | 2/2010 | Gunnam |
| 2010/0042906 A1 | 2/2010 | Gunnam et al. |
| 2011/0087933 A1 | 4/2011 | Varnica et al. |
| 2011/0252286 A1 | 10/2011 | Li et al. |
| 2011/0264979 A1 | 10/2011 | Gunnam et al. |
| 2011/0293045 A1 | 12/2011 | Gross et al. |
| 2012/0134446 A1* | 5/2012 | Zhou ................... H03M 13/655 375/320 |
| 2012/0173947 A1 | 7/2012 | Voicila et al. |
| 2012/0185744 A1 | 7/2012 | Varnica et al. |
| 2012/0243329 A1* | 9/2012 | Nagashima ............ G11C 16/10 365/185.22 |
| 2013/0061107 A1 | 3/2013 | Wang et al. |
| 2013/0061112 A1 | 3/2013 | Chen et al. |
| 2013/0139022 A1 | 5/2013 | Chen et al. |
| 2013/0156133 A1 | 6/2013 | Gentile et al. |
| 2013/0346824 A1 | 12/2013 | Bolotov et al. |

OTHER PUBLICATIONS

Wymeersch, Henk et al. "Log-Domain Decoding of LDPC Codes Over GF(q)," IEEE International Conference on Communications, vol. 2, Jun. 2004, pp. 772-776.

Tarable, Alberto et al. "Mapping Interleaving Laws to Parallel Turbo and LDPC Decoder Architectures," IEEE Transactions on Information Theory, vol. 50, No. 9, Sep. 2004, pp. 2002-2009.

Hocevar, Dale E. "A Reduced Complexity Decoder Architecture Via Layered Decoding of LDPC Codes," IEEE Workshop on Signal Processing Systems, Oct. 2004, pp. 107-112.

Neeb, Christian et al. "Network-on-Chip-Centric Approach to Interleaving in High Throughput Channel Decoders," IEEE International Symposium on Circuits and Systems, vol. 2, May 2005, pp. 1766-1769.

Mansour, Mohammad M. et al. "A 640-Mb/s 2048-Bit Programmable LDPC Decoder Chip," IEEE Journal of Solid-State Circuits, vol. 41, No. 3, Mar. 2006, pp. 684-698.

Darabiha, Ahmad et al. "A Bit-Serial Approximate Min-Sum LDPC Decoder and FPGA Implementation," IEEE International Symposium on Circuits and Systems, May 2006, pp. 149-152.

Declercq, David et al. "Decoding Algorithms for Nonbinary LDPC Codes Over GF (q)," IEEE Transactions on Communications, vol. 55, No. 4, Apr. 2007, pp. 633-643.

Gunnam, Kiran et al. "Multi-Rate Layered Decoder Architecture for Block LDPC Codes of the IEEE 802.11n Wireless Standard," IEEE International Symposium on Circuits and Systems, May 2007, pp. 1645-1648.

Savin, Valentin "Min-Max Decoding for Non Binary LDPC Codes," IEEE International Symposium on Information Theory, Jul. 2008, pp. 960-964.

Darabiha, Ahmad et al. "Power Reduction Techniques for LDPC Decoders," IEEE Journal of Solid-State Circuits, vol. 43, No. 8, Aug. 2008, pp. 1835-1845.

Zhou, Bo et al. "Construction of Non-Binary Quasi-Cyclic LDPC Codes by Arrays and Array Dispersions," IEEE Transactions on Communications, vol. 57, No. 6, Jun. 2009, pp. 1652-1662.

Jin, Jie et al. "An Energy Efficient Layered Decoding Architecture for LDPC Decoder," IEE Transactions on Very Large Scale Integration (VLSI) Systems, vol. 18, No. 8, Aug. 2010, pp. 1185-1195.

Lee, Kihoon et al. "A High-Speed Low-Complexity Concatenated BCH Decoder Architecture for 100 Gb/s Optical Communications," Springer Science+Business Media, LLC, Aug. 2010, 13 pages.

Sun, Yang et al. "Multi-Layer Parallel Decoding Algorithm and VLSI Architecture for Quasi-Cyclic LDPC Codes," IEEE International Symposium on Circuits and Systems, May 2011, pp. 1776-1779.

Zhang, Xinmiao et al. "Reduced-Complexity Decoder Architecture for Non-Binary LDPC Codes," IEEE Transactions on Very Large Scale Integration (VLSI) Systems, vol. 19, No. 7, Jul. 2011, pp. 1229-1238.

Chen, Xiaoheng et al. "High-Throughput Efficient Non-Binary LDPC Decoder Based on the Simplified Min-Sum Algorithm," IEEE Transactions on Circuits and Systems-I: Regular Papers, vol. 59, No. 11, Nov. 2012, pp. 2784-2794.

Li, Erbao et al. "Trellis-Based Extended Min-Sum Algorithm for Non-Binary LDPC Codes and its Hardware Structure," IEEE Transactions on Communications, vol. 61, No. 7, Jul. 2013, pp. 2600-2611.

Cai, Fang et al. "Relaxed Min-Max Decoder Architectures for Nonbinary Low-Density Parity-Check Codes," IEEE Transactions on Very Large Scale Integration (VLSI) Systems, vol. 21, No. 11, Nov. 2013, pp. 2010-2023.

Huang, et al., "A Low-Complexity Encoding of Quasi-Cyclic Codes Based on Galois Fourier Transform", Cornell University Library, arXiv.org > cs > arXiv:1301.3220v1, submitted Jan. 15, 2013, 8 pages.

Huang, et al., "Low-Complexity Encoding of Quasi-Cyclic Codes Based on Galois Fourier Transform", IEEE Transactions on Communications, vol. 62, Issue 6, Jun. 2014, 10 pages.

Zhang, Xinmiao et al. "High-Speed Multi-Block-Row Layered Decoder for Low Density Parity Check (LDPC) Codes," U.S. Appl. No. 14/257,800, filed Apr. 21, 2014, 41 pages.

Zhang, Xinmiao et al. "Low Complexity Partial Parallel Architectures for Fourier Transform and Inverse Fourier Transform Over Subfields of a Finite Field," U.S. Appl. No. 14/258,679, filed Apr. 22, 2014, 44 pages.

Zhang, Xinmiao "Modified Trellis-Based Min-Max Decoder for Non-Binary Low-Density Parity-Check Error-Correcting Codes," U.S. Appl. No. 14/272,621, filed May 8, 2014, 33 pages.

Zhang, Xinmiao et al. "Encoder with Transform Architecture for LDPC Codes Over Subfields Using Message Mapping," U.S. Appl. No. 14/316,117, filed Jun. 26, 2014, 38 pages.

Zhang, Xinmiao et al. "Encoder for Quasi-Cyclic Low-Density Parity-Check Codes Over Subfields Using Fourier Transform," U.S. Appl. No. 14/316,128, filed Jun. 26, 2014, 36 pages.

Non-Final Office Action mailed Jan. 8, 2016 in U.S. Appl. No. 14/257,800, 10 pages.

Cui, Z. et al. "Reduced-Complexity Column-Layered Decoding and Implementation for LDPC Codes," IET Communications, 2011, vol. 5, Issue 15, pp. 2177-2186.

Non-Final Office Action mailed Nov. 4, 2015 in U.S. Appl. No. 14/272,621, 15 pages.

Zhou et al., "Array Dispersions of Matrices and Constructions of Quasi-Cyclic LDPC Codes Over Non-Binary Fields", IEEE International Symposium on Information Theory, Toronto, Canada, Jul. 6-11, 2008, 1158-1162.

Final Office Action dated Jun. 23, 2016, in U.S. Appl. No. 14/257,800, 12 pages.

Notice of Allowance and Fee(s) Due dated Jul. 29, 2016, in U.S. Appl. No. 14/272,621, 9 pages.

Notice of Allowance and Fee(s) Due dated Nov. 1, 2016, in U.S. Appl. No. 14/257,800, 5 pages.

Final Office Action dated Mar. 1, 2016 in U.S. Appl. No. 14/272,621, 17 pages.

* cited by examiner

INTERLEAVED LAYERED DECODER FOR LOW-DENSITY PARITY CHECK CODES

FIELD OF THE DISCLOSURE

The present disclosure is generally related to low-density parity check (LDPC) decoders.

BACKGROUND

Nonvolatile data storage devices, such as embedded memory devices and removable memory devices, enable portability of data and software applications. In certain flash memory devices, multi-level cell (MLC) storage elements may each store a threshold voltage representing multiple bits of data, enhancing data storage density as compared to single-level cell (SLC) flash memory devices. The enhanced storage density may be associated with increased data errors.

To correct data errors, a flash memory device may utilize an error correcting code (ECC) technique. For example, the flash memory device may encode user data using an ECC technique to generate encoded data, such as an ECC codeword. The encoded data may be stored at the flash memory device and may be decoded by a decoder of the flash memory device, such as in response to a request for read access to the data from a host device that accesses the flash memory device.

The flash memory device may use a low-density parity check (LDPC) decoding technique to decode the data. Because of the complexity of LDPC computations, numerous techniques for decoding LDPC-encoded data have been developed. LDPC decoding techniques typically use multiple iterations to decode data, which consumes power and processing resources. Various techniques are needed to reduce power consumption and improve utilization of processing resources.

SUMMARY

A data storage device may include a memory and a controller that is operationally coupled to the memory. The controller may read and write information at the memory. For example, the controller may read and write error correcting code (ECC) codewords at the memory. An ECC codeword may be encoded using a low-density parity check (LDPC) encoding technique prior to storage at the memory. The memory location storing the ECC codeword may be accessed to generate information (such as a "received word") that corresponds to the ECC codeword but that may include one or more errors.

To correct the one or more errors, a decoder of the controller may pipeline-process multiple blocks of data simultaneously in an interleaved manner using a column-parallel layered decoding technique. The number of data blocks interleaved is based on the number of stages of the pipeline. The layered decoding can be applied to speed up the convergence of the decoding. By pipelining and interleaving the data blocks, clock frequency and hardware efficiency can be increased at the decoder.

DETAILED DESCRIPTION

Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. As an illustrative example, LDPC techniques may be utilized to improve reliability of wired or wireless communications. Those of skill in the art will recognize that techniques described herein are applicable to other implementations. Further, certain examples herein are described in terms of a representative value (e.g., generating a single value) for convenience of description. A single value may be included in a vector that includes multiple values. Therefore, although examples are provided using a single value for clarity of illustration, it should be appreciated that a value may be included in a vector.

Figure 1:
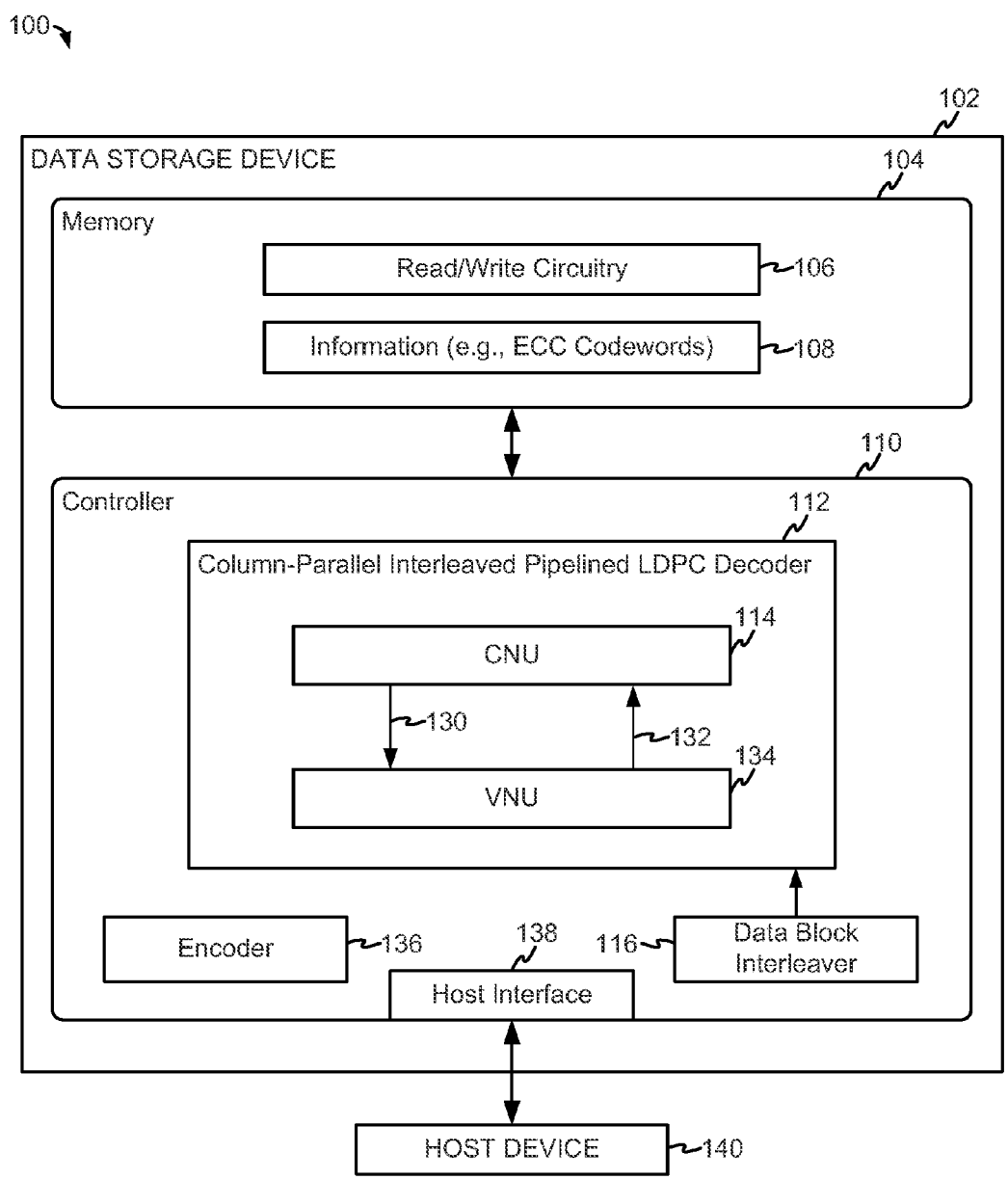
FIG. 1 is a block diagram of a particular illustrative embodiment of a system including a data storage device that includes a decoder.

Referring to FIG. 1, a particular illustrative embodiment of a system is depicted and generally designated 100. The system 100 includes a data storage device 102 and a host device 140. The data storage device 102 and the host device 140 may be coupled via a connection, such as a wireless connection or a bus. The data storage device 102 may be embedded within the host device 140, such as in accordance with a Joint Electron Devices Engineering Council (JEDEC) Solid State Technology Association Universal Flash Storage (UFS) configuration. Alternatively, the data storage device 102 may be removable from the host device 140 (i.e., "removably" coupled to the host device 140). As an example, the data storage device 102 may be removably coupled to the host device 140 in accordance with a removable universal serial bus (USB) configuration.

The data storage device 102 may include a memory 104. The memory 104 may include a non-volatile memory, such as a non-volatile NAND flash memory or a non-volatile resistive random access memory (ReRAM). The memory 104 may have a three-dimensional (3D) memory configuration. Alternatively, the memory 104 may have another configuration, such as a two-dimensional (2D) memory configuration.

The memory 104 may include read/write circuitry 106. In a particular implementation, the memory 104 is a non-volatile memory having a three-dimensional (3D) memory configuration that is monolithically formed in one or more physical levels of arrays of memory cells having an active area disposed above a silicon substrate. The data storage device 102 may include circuitry, such as the read/write circuitry 106, that is associated with operation of the memory cells.

The memory 104 may include one or more physical pages of storage elements (e.g., word lines of storage elements). The physical pages may be included in one or more blocks (e.g., an erase group of word lines) of the memory 104. The memory 104 may include multiple blocks of physical pages. The physical pages may store data, such as information 108. To illustrate, one or more of the physical pages may correspond to a physical page of single-level cell (SLC) storage elements that can be programmed using the read/write circuitry 106 to store threshold voltages indicating bit values of a logical page, such as in connection with a one-bit-per-cell ("X1") configuration. Alternatively, one or more of the physical pages may correspond to a physical page of multi-level cell (MLC) storage elements that can be programmed using the read/write circuitry 106 to store threshold voltages indicating bit values of multiple logical pages, such as in connection with a two-bit-per-cell ("X2") configuration or a three-bit-per-cell ("X3") configuration, as illustrative examples.

The data storage device 102 may further include a controller 110. The memory 104 and the controller 110 may be operationally coupled via a connection, such as a bus. The controller 110 may include a decoder 112, a data block interleaver 116, an encoder 136, and a host interface 138. The encoder 136 and the decoder 112 are configured to operate according to one or more low-density parity check (LDPC) techniques. An example of an LDPC technique is a "layered" LDPC decoding technique, such as a row-layered LDPC decoding technique that "layers" a parity check matrix by rows (or block rows). In accordance with the present disclosure, a decoder may operate using a row-layered LDPC decoding technique that processes each column of a row in parallel (e.g., using a "column-parallel" decoding process). For example, the decoder 112 is configured to decode information using a column-parallel interleaved pipelined LDPC decoding technique. An example of the data flow in the decoding of a first layer and a second layer are described further with reference to FIG. 5. It is noted that a different number of layers may be utilized (e.g., three or more layers).

The decoder 112 includes a check node unit (CNU) 114 and a variable node unit (VNU) 134. Certain operations of the CNU 114 can be carried out by mapping a v2c message to a trellis. The CNU 114 may be pipelined (e.g., may include pipeline registers). The CNU 114 may include p pipeline stages, where p indicates an integer number that is greater than one (e.g., five).

The controller 110 is configured to receive data and instructions from the host device 140 via the host interface 138 and to send data to the host device 140 via the host interface 138. The controller 110 is configured to send data and commands to the memory 104 and to receive data from the memory 104. For example, the controller 110 is configured to send data and a write command to cause the memory 104 to store the data to a specified address of the memory 104. The controller 110 is configured to send a read command to read data from a specified address of the memory 104.

The host device 140 may correspond to a mobile telephone, a computer, (e.g., a laptop, a tablet, or a notebook computer), a music player, a video player, a gaming device or console, an electronic book reader, a personal digital assistant (PDA), a portable navigation device, another electronic device, or a combination thereof. The host device 140 may communicate via a host controller, which may enable the host device 140 to communicate with the data storage device 102. The host device 140 may operate in compliance with a JEDEC Solid State Technology Association industry specification, such as an embedded MultiMedia Card (eMMC) specification or a Universal Flash Storage (UFS) Host Controller Interface specification. The host device 140 may operate in compliance with one or more other specifications, such as a Secure Digital (SD) Host Controller specification as an illustrative example. Alternatively, the host device 140 may communicate with the data storage device 102 in accordance with another communication protocol.

In operation, the controller 110 may receive data to be stored at the memory 104. For example, the controller 110 may receive a request for write access from the host device 140 via the host interface 138 to write data at the memory 104. In response to receiving the data, the controller 110 may input the data to the encoder 136 to encode the data. The encoder 136 may encode the data using a low-density parity check (LDPC) encoding technique. For example, the controller 110 may input the data at the encoder 136, and the encoder 136 may encode the data using an LDPC encoding technique to generate an error correcting code (ECC) codeword. The information 108 may include ECC codewords. As an illustrative, non-limiting example, the information 108 may include ECC codewords representing user data, such as an image file, an audio file, or a video file. Alternatively or in addition, the information 108 may include ECC codewords representing other information.

The controller 110 may send the ECC codewords to the memory 104. To illustrate, the controller 110 may cause the read/write circuitry 106 to store the information 108 at the memory 104, such as at word lines of storage elements of the memory 104.

The controller 110 may receive a request for read access to the memory 104 from the host device 140. For example, the controller 110 may receive a request for read access to the information 108 from the host device 140 via the host interface 138. In response to receiving the request for read access, the controller 110 may access the information 108. For example, the controller 110 may cause the read/write circuitry 106 to sense the information 108 from the memory 104 to generate multiple data blocks. The read/write circuitry 106 may cause the data blocks to be output to the controller 110 (e.g., via a set of data latches of the memory 104).

In response to receiving the data blocks, the decoder 112 may perform a decoding operation to decode the data blocks (also referred to as "channel information" herein). To illustrate, the information 108 may include a first received word (or a first "data block") and may further include a second received word (or a second "data block").

The data block interleaver 116 may be configured to interleave (e.g., reorder) the data blocks to generate interleaved data blocks. For example, the data block interleaver 116 may be configured to perform out-of-order scheduling of data blocks to generate the interleaved data blocks. The data block interleaver 116 is configured to provide the interleaved data blocks to the decoder 112. As an illustrative, non-limiting example, the data block interleaver 116 may include a memory (e.g., a buffer) to store the interleaved data blocks. The memory may be accessible to the decoder 112. For example, the decoder 112 may be configured to access the memory to retrieve the interleaved data blocks, or the data block interleaver 116 may be configured to provide the interleaved data blocks from the memory to the decoder 112.

The CNU 114 may utilize information representing log-likelihood ratio (LLR) values indicating reliabilities of values of the data blocks. In an illustrative embodiment, the reliabilities may be generated based on "soft" values that are generated by sensing the information 108 using a soft read technique. The CNU 114 may process the interleaved data blocks in an interleaved manner using a pipelined layered decoding process to generate updated LLR values. A layer may correspond to one or more block rows of the parity check matrix.

The CNU 114 may send a c2v message 130 to the VNU 134. The VNU 134 may generate a v2c message 132. The decoder 112 may represent the v2c messages using a transformed trellis. The decoder 112 may be further configured to generate syndrome values based on the transformed v2c message vectors and to generate c2v message vectors based on the syndrome values, etc.

The decoding operations described above continue until either the decoder 112 converges on a valid ECC codeword (e.g., "succeeds" at decoding the data blocks, such as by correcting one or more errors associated with the data blocks) or until the decoder 112 reaches a threshold number of iterations without converging to a valid codeword (or "fails" at decoding the information 108 by "timing out"). The controller 110 may send information (e.g., user data) to the host device 140 via the host interface 138 in response to decoding the data blocks.

The techniques described with reference to FIG. 1 enable increased decoding throughput by maintaining a high clock frequency and hardware efficiency at the decoder 112. To illustrate, certain conventional decoders process information on a per-column basis (or "one column at a time"), which leads to low throughput. To increase throughput, a decoder may process multiple columns in parallel. However, processing multiple columns in parallel may result in a greater critical path, resulting in lower clock frequency at the decoder. To increase the clock frequency, the data blocks may be processed at the decoder 112 in a pipelined manner. Due to data dependencies, pipeline-processing multiple columns in such a manner may lead to a single pipeline stage being utilized during each clock cycle. Therefore, data blocks may be interleaved to increase hardware utilization at the decoder 112, which further increases the throughput.

FIGS. 2-5 illustrate certain aspects for example configurations of the decoder 112 of FIG. 1. It is noted that the examples are illustrative and non-limiting.

A high-speed column-parallel layered decoder architecture may process all the columns in a layer simultaneously. In an example embodiment, the decoder may operate in accordance with a finite field of size four (GF(4)). The low-order of GF(4) enables simplifications to the decoder. To illustrate, a modified trellis-based non-binary decoder computes one single syndrome vector for each check node, and all c2v messages from the same check node may be derived from the syndromes by simple selection logic, and this feature facilitates column-parallel processing. In other implementations, a decoder may operate using a binary LDPC decoding technique. By using column-parallel processing, c2v message generation may become more complicated, and pipelining and interleaving may be used to improve decoding throughput in this case. For example, pipelining and interleaving may be applied to the data path in non-binary LDPC (NB-LDPC) decoders to achieve a high clock frequency and high hardware utilization efficiency. Pipelining and interleaving may be applied to other decoders, such as binary LDPC decoders. Due to data dependency, decoding of a next layer does not start before completion of decoding of a current layer. As a result, each pipelining stage of such a decoder may be only active for one clock cycle in the column-parallel decoding of each layer. To increase hardware utilization efficiency, if the data path is divided into p pipelining stages, then p data blocks can be interleaved. The only hardware penalty brought by the interleaving is the storage of c2v messages for each data block. The c2v messages may be stored in a compressed manner, thus reducing overhead. Moreover, an architecture may be enhanced by taking into account the specifics of a modified trellis-based non-binary decoder.

Assume that the column weight of the H matrix is $d_v$. In a column-parallel decoder, the inputs to the CNU 114 only change from layer to layer. Hence, for each input vector to the CNU 114, a simple $d_v$-to-1 multiplexor may be used. The multiplexor may be used to select between v2c messages at the input of the CNU 114. The messages within each vector may be permuted and reshuffled, which may be implemented by small networks of multiplexors for GF(4) codes.

The sorting step finds the minimum and second minimum LLRs, denoted by min1 and min2, respectively, among the $d_c$ input v2c messages with the same nonzero finite field element, where $d_c$ indicates a row weight of the parity check matrix. When $d_c$ is not small, an iterative bit-serial architecture for finding the minimum value among all $d_c$ inputs costs less hardware. However, if the word length is b, 2b clock cycles may be used to find the min1 and min2 log-likelihood ratio (LLR) values, and iterative loops prohibit pipelining from being applied. To achieve high throughput, an efficient feedback-free parallel architecture in accordance with the present disclosure may be utilized for finding the min1 and min2 values.

Figure 2:
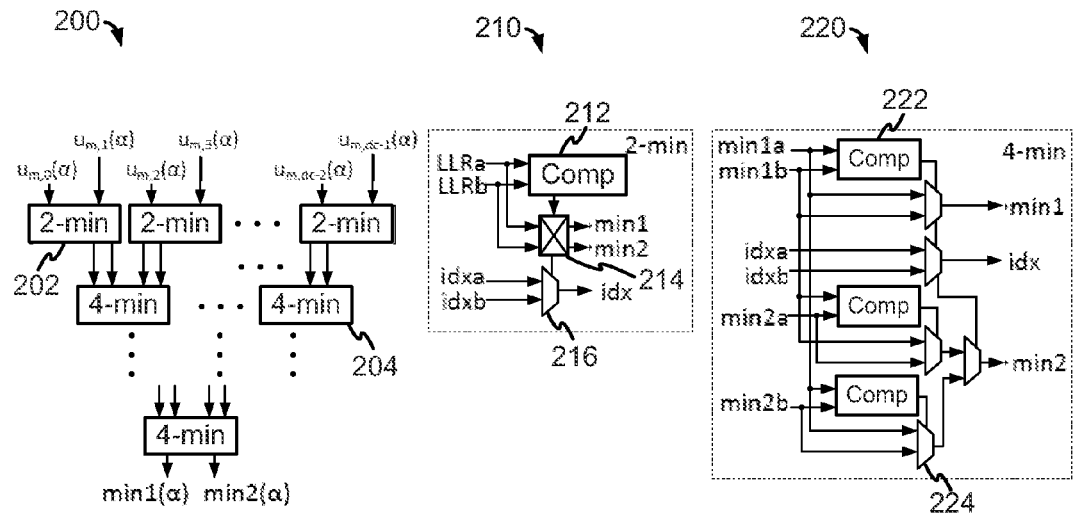
FIG. 2 is a diagram of a particular illustrative embodiment of a tree sorter that may be included in a check node to variable node message generator of the decoder of the data storage device of FIG. 1.

FIG. 2 illustrates an example of a tree sorter 200 that may be implemented to enable column-parallel check node processing. FIG. 2 further illustrates a "2-min" unit 210 that may be included in the tree sorter 200, and a "4-min" unit 220 that may be included in the tree sorter 200. The tree sorter 200 may be included in the CNU 114 of FIG. 1.

FIG. 2 depicts that the tree sorter 200 may include multiple 2-min units, such as a representative 2-min unit 202, and multiple 4-min units, such as a representative 4-min unit 204. In an illustrative embodiment, one or more 2-min units of the tree sorter 200 (e.g., the 2-min unit 202) may be implemented in accordance with the 2-min unit 210, and one or more 4-min units of the tree sorter 200 (e.g., the 4-min unit 204) may be implemented in accordance with the 4-min unit 220.

The tree sorter 200 is responsive to multiple v2c messages (e.g., the v2c message 132) that may include multiple LLR values. The LLR values for a message vector may be defined as $l(\alpha)=\log(P(\hat{\alpha})/P(\alpha))$, where $\alpha$ is an element of a finite field of size q (i.e., GF(q)) and $\hat{\alpha}$ is the most likely element. In this example, each LLR is non-negative, and the smaller the LLR, the more reliable the corresponding message (with a zero LLR indicating the highest reliability). As used herein, the LLR vector from check node m to variable node n is denoted as $v_{m,n}$ and that from variable node n to check node m is denoted as $u_{m,n}$.

FIG. 2 depicts that the tree sorter 200 may receive multiple v2c messages that include LLR values including a value $u_{m,0}(\alpha)$, a value $u_{m,1}(\alpha)$, a value $u_{m,2}(\alpha)$, a value $u_{m,3}(\alpha)$, a value $u_{m,dc-2}(\alpha)$, and a value $u_{m,dc-1}(\alpha)$. It should be appreciated that a different number of v2c messages may be used than the particular example of FIG. 2 depending on the value of $d_c$. The tree sorter 200 may sort the LLR values to determine a first value (e.g., $\min1(\alpha)$) and a second value (e.g., $\min2(\alpha)$). In an illustrative implementation, the decoder 112 is a trellis-based NB-LDPC decoder that computes a syndrome value (w(α)) based on the first value and the second value. In other implementations, the decoder 112 is configured to operate using a binary LDPC decoding technique.

The 2-min unit 210 may include a comparator 212, a switch 214, and a multiplexor (MUX) 216. The switch 214 is coupled to the comparator 212 and is further coupled to the MUX 216.

The 2-min unit 210 may be responsive to a first LLR value (LLRa) and a second LLR value (LLRb). For example, the comparator 212 may compare the first LLR value and the second LLR value and may provide a control signal to the switch 214 indicating which of the first LLR value and the second LLR value is greater. If the control signal indicates that the first LLR value is less than the second LLR value, the switch 214 outputs the first LLR value as "min1" and the second LLR value as "min2." If the control signal indicates that the second LLR value is less than the first LLR value, the switch 214 outputs the second LLR value as "min1" and the first LLR value as "min2."

The MUX 216 may be responsive to the control signal generated by the comparator 212. The MUX 216 may output an index value (idx) by selecting a first index value (idxa) associated with the first LLR value or a second index value (idxb) associated with the second LLR value based on the control signal. For example, if the control signal indicates that the first LLR value is less than the second LLR value, the MUX 216 may select the first index value. If the control signal indicates that the second LLR value is less than the first LLR value, the MUX 216 may select the second index value.

The example operations of the 2-min unit 210 may be used in connection with a 4-min unit, such as the 4-min unit 220. The 4-min unit 220 may include multiple comparators, such as a representative comparator 222. The 4-min unit 220 may further include multiple MUXes, such as a representative MUX 224. The 4-min unit 220 may receive LLR values (min1a, min1b, min2a, and min2b) and index values (idxa, idxb). The 4-min unit 220 may perform comparison operations to select one of the LLR values as a min1 value and another of the LLR values as a min2 value. The 4-min unit 220 may output an index value (idx) associated with the min1 value.

As shown in FIG. 2, an example architecture includes a tree of 2-min and 4-min units. A 2-min unit compares two inputs, switches the LLRs according to their relative magnitudes, and also routes the index of the smaller LLR to a designated output. A 4-min unit finds the min1 and min2 among two pairs of min1 and min2 LLRs. Since the min2 is larger than the min1 within each pair, the comparisons and multiplexing are simplified.

The syndrome vector, w, for a check node is computed based on all its input v2c message vectors. For codes over GF(4), each of the syndromes for w(α) (e.g., for α=1, α=β, and α=β^2) can be computed by three comparators and multiple multiplexors, where β is a primitive element of GF(4). The c2v message computation can be further simplified by taking advantage of the column-parallel processing. To decide a c2v LLR value to variable node n, a determination is made of whether n equals any of the three indexes of the min1 messages. When only one c2v vector from each check node is to be computed at a time, this is done by three equality testers. When all the c2v vectors from a check node are computed simultaneously, having three equality testers for each c2v vector is redundant. Instead, taking idx(α) as the input, a $\log_{d_c}$-to-$d_c$ binary decoder can generate all the signals of whether n=idx(α) for n=0, 1, . . . , $d_c$−1. As a result, the c2v message computation can be implemented by the simplified architecture shown in FIG. 3.

Figure 3:
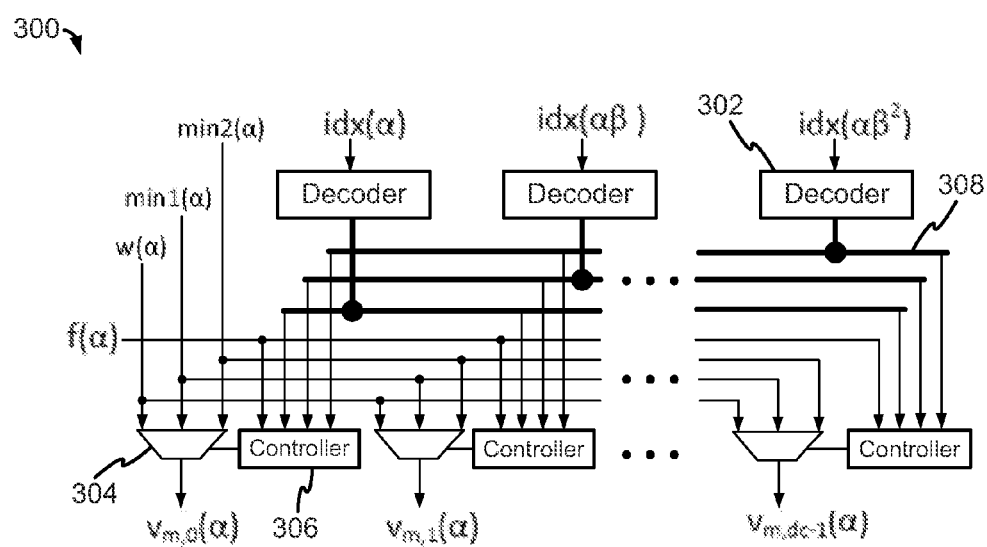
FIG. 3 is a diagram of a particular illustrative embodiment of a portion of a check node to variable node message generator that may be included in the decoder of the data storage device of FIG. 1.

FIG. 3 illustrates a device 300 that may be included in the CNU 114 of FIG. 1. The device 300 may include multiple binary decoder units, such as a representative binary decoder unit 302. The device 300 may further include multiple MUXes, such as a representative MUX 304. The device 300 may further include multiple control units, such as a representative control unit 306. The device 300 may further include a plurality of multi-bit buses, such as a representative multi-bit bus 308. In the example of FIG. 3, the binary decoder unit 302 is coupled to the multi-bit bus 308. The multi-bit bus 308 may be configured to bus a multi-bit signal of $d_c$ bits. The device 300 may include $d_c$ MUXes, $d_c$ control units, and three binary decoder units (e.g., corresponding to the three non-zero elements of GF(4)), as illustrated in the example of FIG. 3).

FIG. 3 depicts that each binary decoder unit may be responsive to a respective index value associated with the min1 value of each non-zero element of a finite field, such as a first index value (idx(α)), a second index value (idx (αβ)), or a third index value (idx(αβ^2)). The binary decoder units may be configured to decode the index values. The device 300 may generate a c2v message (e.g., the c2v message 130) that includes multiple LLR values. For example, the device 300 may generate a value $v_{m,0}(α)$, a value $v_{m,1}(α)$, and a value $v_{m,dc-1}(α)$. The device 300 may be responsive to an indication f(α), where f(α) may have a value of either zero (e.g., if min1(α)<max(min1(αβ),min1 (αβ^2)) for each α≠0) or one (e.g., if min1(α)≥max(min1 (αβ),min1(αβ^2))). Each of the control units of FIG. 3 may be responsive to the indication f(α).

Having a tester of whether n=idx(α) for each c2v vector takes around $d_c(\log_2 d_c + \log_2(\log_2 d_c))$ 2-input logic gates, while a $\log_{d_c}$-to-$d_c$ binary decoder may use about $d_c(\log_2(\log_2 d_c))$ gates. The logic for generating the control signal for each multiplexor in FIG. 3 may be implemented using a small number of gates (e.g., two or three gates).

Figure 4:
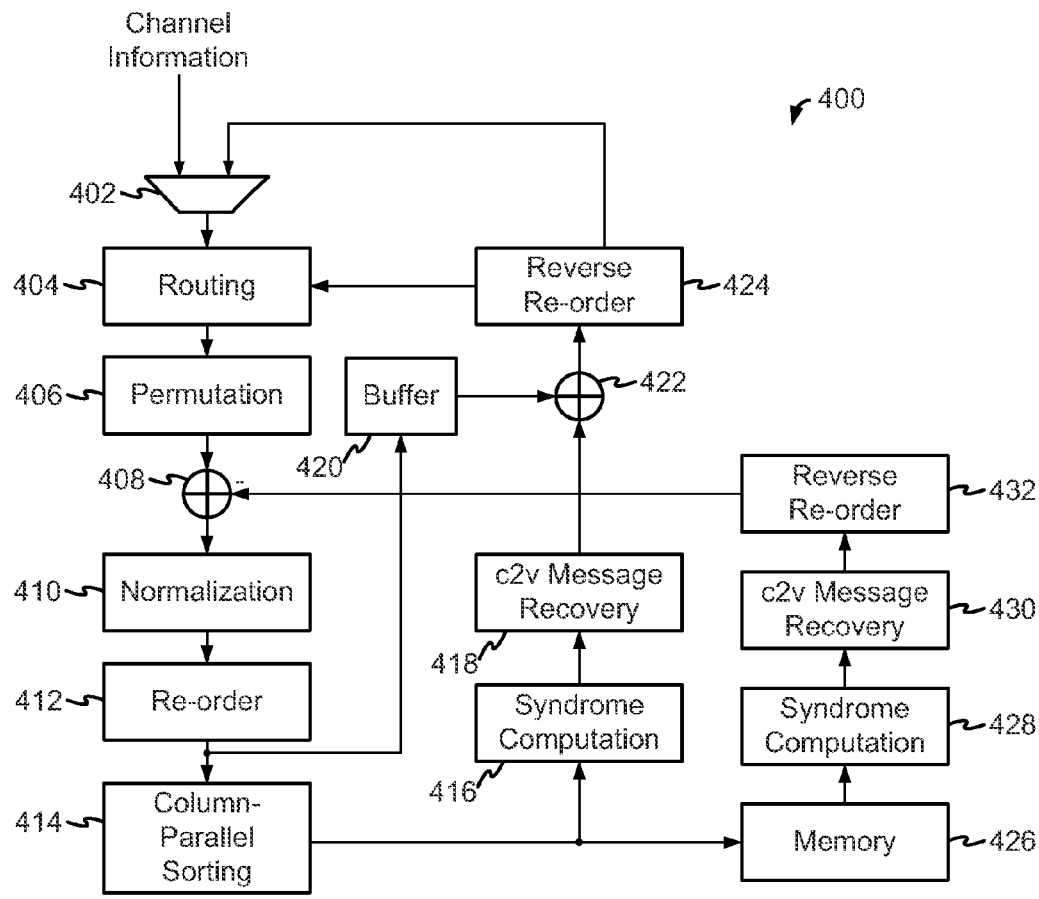
FIG. 4 is a data flow diagram of a particular illustrative embodiment of a process that may be performed by the decoder of the data storage device of FIG. 1.

FIG. 4 is a data flow diagram of a process 400 that may be performed by the decoder 112 of FIG. 1 to implement interleaved pipelined column-parallel decoding operations. A decoder may include one or more data paths. To illustrate, a data path of the decoder may be configured to perform a selection operation 402, a routing operation 404, a permutation operation 406, a subtraction operation 408, a normalization operation 410, a re-order operation 412, a column-parallel sorting operation 414, a syndrome computation operation 416, a c2v message recovery operation 418 (e.g., CNU processing), a buffer operation 420, an addition operation 422, and a reverse re-order operation 424. As another example, another data path of the decoder may be configured to perform a memory operation 426, a syndrome computation operation 428, a c2v computation operation 430, and a reverse re-order operation 432. The data paths may be pipelined, and each pipelining stage may include (or may be configured to perform) one or multiple operations in the data path. In other implementations, a decoder may have a different configuration.

Making use of the components described above, an example architecture for the proposed column-parallel layered decoder is shown in FIG. 4. At the input of the sorter, the zero field element should have zero LLR in each v2c vector. Therefore, the normalization and re-ordering is to be performed just before the sorting. The channel information does not need to be stored in layered decoders. However, to compute the extrinsic messages, the c2v messages of the previous decoding iteration are subtracted. Storing the c2v messages of the previous decoding iteration for each layer leads to very large memory requirement. Instead, a decoder may store the sorting results, which are min1($\alpha$), min2($\alpha$), idx($\alpha$) for each $\alpha \neq 0$. The sorting results can be considered as compressed c2v messages. When the c2v messages for the previous iteration are to be used, they are recovered by using a second copy of the syndrome and c2v message computation engines. FIG. 3 illustrates that c2v message computation engines may be implemented using multiplexors and simple control logic. Hence, the overhead brought by this additional copy of syndrome and c2v computation units is small. The c2v messages are added up with the input of the sorters to derive the intrinsic messages. Originally, the intrinsic messages may go through reverse permutation and reverse routing. However, the outputs of these two blocks are sent to the routing and permutation for the next layer. Since the H matrix is fixed and recorded, the reverse permutation (routing) can be combined with permutation (routing) without requiring additional hardware. Nevertheless, since the $\hat{\alpha}$ that controls the re-ordering varies as the decoding proceeds, the two inputs of the subtractor may have been re-ordered differently. Therefore, the re-order and its reverse may not be combinable.

In an implementation where the data path of a layered decoder is pipelined into p stages, the decoding of each layer takes p clock cycles. After the data moves to the next pipelining stage, the current stage becomes idle. Due to the data dependency, the decoding of the next layer does not start until that of the current layer is completed. As a result, only one pipelining stage is active at any time, leading to hardware inefficiency. To address this issue, the decoding of p data blocks may be interleaved as shown in FIG. 5.

Figure 5:
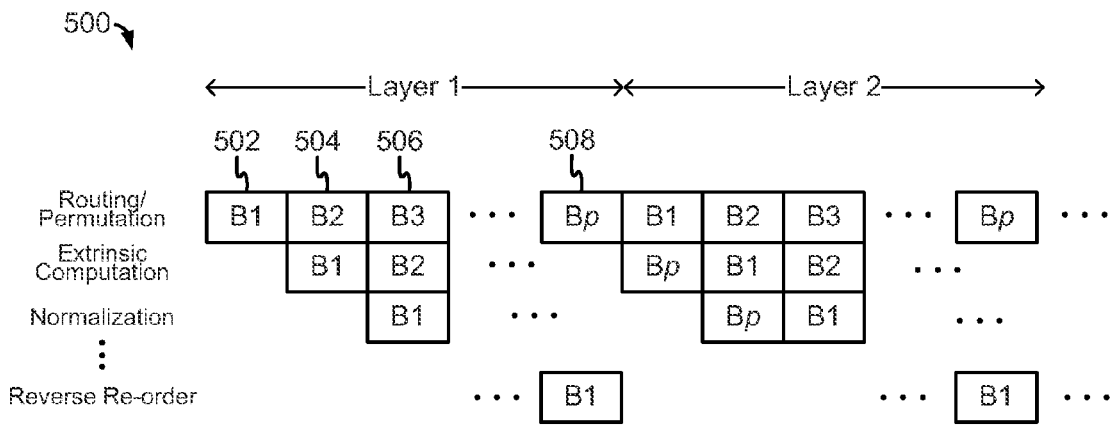
FIG. 5 illustrates an example data block interleaving schedule that may be used by the decoder of the data storage device of FIG. 1.

FIG. 5 illustrates an example data block interleaving schedule 500 that may be used by the decoder 112 of FIG. 1, such as in connection with the process 400 of FIG. 4. To illustrate, the information 108 may be sensed by the read/write circuitry 106 to generate data blocks. The data blocks may be interleaved by the decoder 112, and the interleaved data blocks may be processed simultaneously by the decoder 112 in a pipelined manner. The data blocks may include a first data block 502, a second data block 504, a third data block 506, and a pth data block 508, where p represents a number of pipeline stages of the data path.

FIG. 5 illustrates scheduling of operations including routing and permutation, extrinsic computation, and reverse re-ordering, etc. as illustrative examples. Each operation may be performed in a column-parallel manner for block rows of a parity check matrix at the same time. In FIG. 5, each of the data blocks 502, 504, 506, and 508 may correspond to a "received word" (e.g., information representing an ECC codeword that may have one or more errors). The data blocks 502, 504, 506, and 508 may correspond to the interleaved data blocks generated by the data block interleaver 116 of FIG. 1.

Although the c2v messages for the previous decoding iteration are stored for p data blocks, since only the compressed messages min1($\alpha$), min2($\alpha$), and idx($\alpha$) may be stored, the memory overhead is small. As a result, a decoder is capable of decoding p data blocks simultaneously with small additional memory as compared to a non-interleaved decoder.

Table 1 illustrates an illustrative hardware complexity configuration based on example (2016, 1764) NB-LDPC code over GF(4) with $d_c$=32 and $d_v$=4. It should be appreciated that the example of Table 1 is provided for illustration and that other LDPC codes are within the scope of the disclosure. In Table 1, the H matrix of the example code is divided into 4 layers. The data path of the decoder is divided into p=8 stages, and hence the decoding of each iteration takes 32 clock cycles. The critical processing path of each stage is around 15 logic gates. With such a critical processing path, a clock frequency of 450 Mhz can be easily achieved using 28 nm CMOS technology. To achieve a similar clock frequency, the data path of a column-serial sliced-message passing modified trellis-based decoder may be divided into 7 pipelining stages, and it takes $d_c$+7=39 clock cycles to finish a decoding iteration.

TABLE 1

Example decoder complexity comparisons for a (2016, 1764) QCNB-LDPC code over GF(4) with $d_c$ = 32 and $d_v$ = 4

| | Modified trellis-based decoder | Interleaved layered trellis-based column-parallel decoder |
|---|---|---|
| Logic gates (XOR) | 266k | 1887k(/8 = 236k) |
| Registers for buffering messages | 20k | 144k(/8 = 18k) |
| Pipelining registers | 30.5k | 228k(/8 = 28.5k) |
| Memory | 60k | 220k(/8 = 27.5k) |
| Clock cycles per iteration | 39 | 32 |

In an illustrative example, 8 data blocks are interleaved and decoded simultaneously. Hence, decoder complexity is divided by 8 to be compared with that of a trellis-based non-binary decoder that decodes one data block at a time. A decoder may not store the channel information. Although the c2v messages of the previous decoding iteration are used, they are stored in compressed format. As a result, the memory usage is much lower for decoding each data block. Extra registers may be used to buffer the inputs of the sorter until they are added up with the computed c2v messages. Nevertheless, the size of this buffer is decided by the number of pipelining stages inside the sorter, the syndrome computation, and c2v message computation units, not the total pipelining stage number. As a result, fewer registers may be used for buffering the messages as compared to conventional decoders. The registers used for pipelining are also indicated in Table 1. Although a decoder may process all columns of H in parallel, only two adders are used for each column. The adders are less complex than a VNU in a sliced message-passing decoder that adds up c2v messages and computes $d_c$ v2c messages. Although the parallel sorter may include complex circuitry, the number of check nodes processed simultaneously may be reduced by 4 times in the layered decoder, and the c2v message computation architecture is further enhanced as shown in FIG. 3. Accordingly, the logic gate count of a decoder may be reduced. In a particular example, the depth of the memory storing the compressed c2v messages for the previous decoding iteration is 4×8=32. Due to the small depth, the memory may be implemented using register files. In an implementation where each register takes around 3 times the area of an XOR, it can be computed from Table 1 that an interleaved-layered decoder may reduce complexity by 23%.

The number of iterations used for decoding different data blocks may vary. To increase hardware utilization efficiency, a new data block may be input to the interleaved decoder once the decoding of any data block is completed. A simple control function may be utilized to keep track of the decoding of each data block.

To further illustrate, in certain implementations, each of the p data blocks may be decoded, and then a new set of p data blocks may be input to the decoder 112 from the data block interleaver 116. In one or more other implementations, a data block may be input to the decoder 112 in response to decoding of a single data block. In this example, after the decoding of a data block is completed, an additional data block is inserted into the decoder in the next clock cycle to increase the hardware utilization efficiency. Accordingly, decoding operations may be performed in an interleaved manner by introducing a data block (e.g., from the data block interleaver 116 to the decoder 112) in response to completion of decoding of another data block. As used herein, an "interleaved manner" may refer to a sequence of decoding operations performed on different data blocks during a decoding process (e.g., as compared to certain turbo code decoding techniques and other techniques that may "interleave" one or more data blocks by "scrambling" information within one or more data blocks). Additional data blocks may be sensed from the memory 104 when the number of data blocks holding in the memory of the data block interleaver 116 is less than a threshold.

Figure 6:
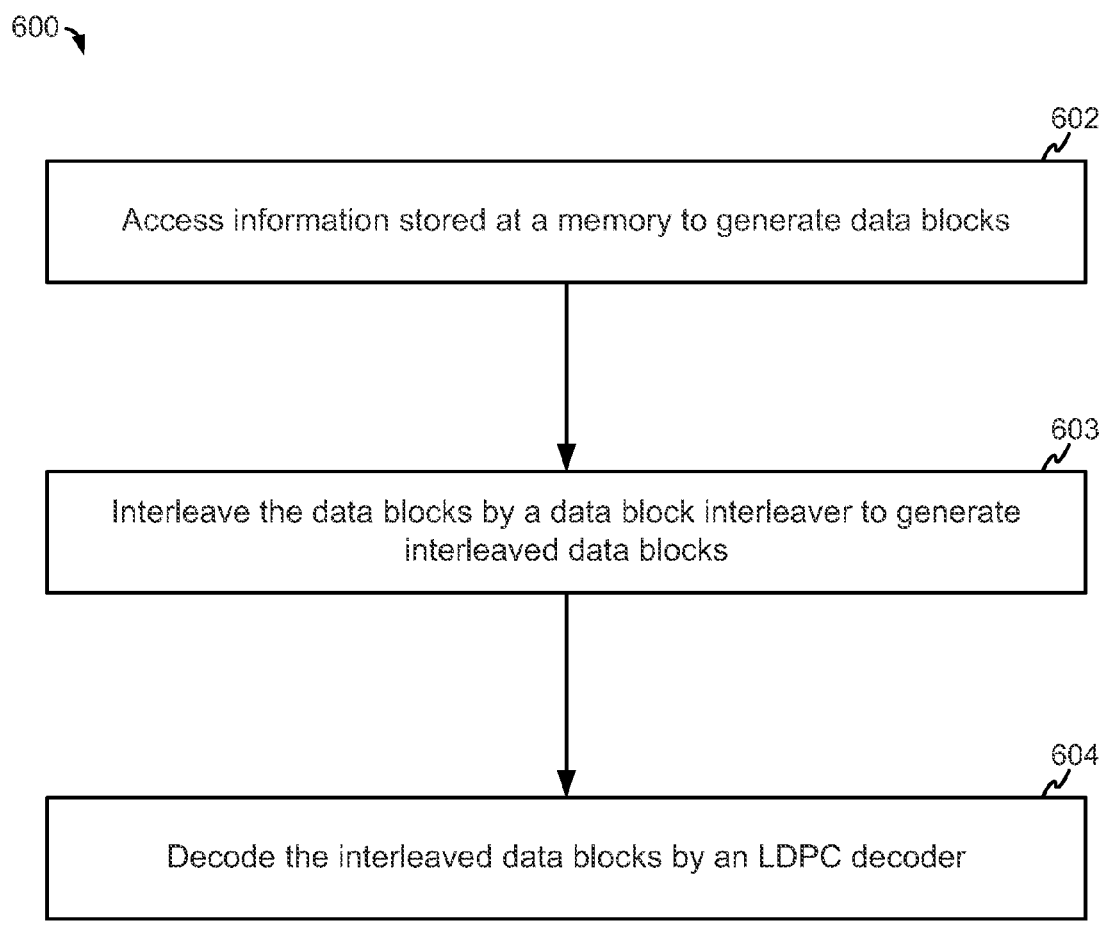
FIG. 6 illustrates a particular illustrative embodiment of a method of operation of the decoder of the data storage device of FIG. 1.

Referring to FIG. 6, a particular illustrative of a method is depicted and generally designated 600. The method may be performed at a data storage device, such as the data storage device 102.

The method 600 includes accessing information stored at a memory to generate data blocks, at 602. The information may correspond to the information 108, and the memory may correspond to the memory 104. To illustrate, the information 108 may be sensed (e.g., by the read/write circuitry 106) to generate the data blocks (or "received words"). The data blocks may correspond to ECC codewords that may have one or more errors.

The method 600 further includes interleaving the data blocks by a data block interleaver to generate interleaved data blocks, at 603. The data block interleaver may correspond to the data block interleaver 116. The interleaved data blocks may correspond to the data blocks 502, 504, 506, and 508 of FIG. 5.

The method 600 further includes decoding the interleaved data blocks by an LDPC decoder, at 604. In a particular embodiment, the LDPC decoder is pipelined, and the data blocks are column-parallel pipeline-processed by the LDPC decoder in an interleaved manner. The LDPC decoder may correspond to the decoder 112.

In connection with the described embodiments, a data storage device (e.g., the data storage device 102) includes a memory (e.g., the memory 104) and a controller (e.g., the controller 110) operationally coupled to the memory. The controller is configured to access information (e.g., the information 108) stored at the memory. The controller includes a data block interleaver (e.g., the data block interleaver 116) and an LDPC decoder (e.g., the decoder 112). The data block interleaver is configured to interleave the data blocks to generate interleaved data blocks, and the LDPC decoder is configured to decode the interleaved data blocks. For example, the LDPC decoder may be configured to column-parallel pipeline-process the data blocks in an interleaved manner.

The data block interleaver may be configured to provide the interleaved data blocks to the LDPC decoder to initiate a decoding process associated with the data blocks. The LDPC decoder may include p pipeline stages, the data block interleaver may be configured to interleave p data blocks, and the LDPC decoder may be configured to column-parallel pipeline-process the p data blocks simultaneously, where p is a positive integer number greater than one. The interleaved data blocks may include a first data block corresponding to a first LDPC error correcting code (ECC) codeword and may further include a second data block corresponding to a second LDPC ECC codeword. A data path of the LDPC decoder may be pipelined. The data path may include a routing stage, a permutation stage, a computation stage, and a re-ordering stage, as illustrative examples.

The LDPC decoder may be a column-parallel interleaved pipelined LDPC decoder. As used herein, "pipelined" or "pipeline processing" may refer to pipelining of—('pipelining' is applicable to hardware, not data blocks or block rows)

The LDPC decoder may include a tree sorter (e.g., the tree sorter 200) configured to determine a first value (e.g., $min1(\alpha)$) and a second value (e.g., $min2(\alpha)$) associated with each non-zero finite field element of a transformed v2c message vector (e.g., among all input transformed v2c message vectors, which may include the v2c message 132). The LDPC decoder may be configured to compute a syndrome value (e.g., $w(\alpha)$) based on the first values.

The LDPC decoder may be further configured to store the first value, the second value, and an index value (e.g., $idx(\alpha)$), such as by caching the first value, the second value, and the index value at a memory of the decoder 112. The LDPC decoder may be further configured to store the first value, the second value, and the index value during a first decoding iteration associated with a first data block of the interleaved data blocks and to access the first value, the second value, and the index value during a second decoding iteration associated with the first data block after the first decoding iteration.

An efficient interleaved layered minimum-maximum (min-max) decoder architecture is described to achieve high throughput. In an example implementation, the decoder is implemented for NB-LDPC codes over a finite field, such as GF(4), although it should be appreciated that the present disclosure is applicable to binary LDPC codes as well as NB-LDPC codes over a finite field having a size other than four. Column-parallel design may be utilized to enable high-speed layered decoding. The c2v message computation is simplified by taking advantage of the column-parallel processing, and an efficient parallel sorter architecture is developed. In addition, the overall layered decoder is enhanced by taking advantage of the trellis-based min-max algorithm. The messages for the previous decoding iteration are stored in a compressed way to reduce the memory usage, and the reverse routing and permutation networks may be eliminated. To increase the hardware utilization efficiency, data blocks are interleaved and decoded simultaneously with small extra memory.

Although one or more components described herein are illustrated as block components and described in general terms, such components may include one or more microprocessors, state machines, and/or other circuits configured to enable the data storage device 102 (or one or more components thereof) to perform operations described herein. One or more components illustrated herein may be coupled using one or more nodes, one or more buses (e.g., data buses and/or control buses), one or more other structures, or a combination thereof. The data storage device 102 may include one or more physical components, such as hardware controllers, state machines, logic circuits, one or more other structures, or a combination thereof, to enable the data storage device 102 to perform one or more operations described herein. One or more aspects of the data storage device 102 may be implemented using a microprocessor or microcontroller programmed (e.g., by executing instructions) to perform operations described herein. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM). One or more operations described herein as being performed by the controller 110 may be performed at the memory 104 (e.g., "in-memory" ECC decoding, as an illustrative example) alternatively or in addition to performing such operations at the controller 110.

The data storage device 102 may be attached to or embedded within one or more host devices, such as within a housing of a host communication device (e.g., the host device 140). For example, the data storage device 102 may be integrated within a packaged apparatus such as a mobile telephone, a music player, a video player, a gaming device or console, an electronic book reader, a personal digital assistant (PDA), a computer, such as a laptop, a tablet, or a notebook computer, a portable navigation device, or other device that uses internal non-volatile memory. However, in other embodiments, the data storage device 102 may be implemented in a portable device configured to be selectively coupled to one or more external devices, such as the host device 140.

To further illustrate, the data storage device 102 may be configured to be coupled to the host device 140 as embedded memory, such as in connection with an embedded Multi-Media Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon. The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a memory; and
a controller operationally coupled to the memory, wherein the controller is configured to access information stored at the memory to generate data blocks, wherein the controller includes a data block interleaver configured to interleave the data blocks to generate interleaved data blocks, and wherein the controller further includes a low-density parity check (LDPC) decoder that is configured to column-parallel pipeline-process the data blocks to decode the interleaved data blocks.

2. The data storage device of claim 1, wherein the data block interleaver is further configured to provide the interleaved data blocks to the LDPC decoder to initiate a decoding process associated with the data blocks.

3. The data storage device of claim 1, wherein the LDPC decoder includes p pipeline stages, wherein the data block interleaver is further configured to interleave p data blocks to generate p interleaved data blocks, wherein the LDPC decoder is further configured to column-parallel pipeline-process the p interleaved data blocks simultaneously, and wherein p is a positive integer number greater than one.

4. The data storage device of claim 1, wherein the interleaved data blocks include a first data block corresponding to a first LDPC error correcting code (ECC) codeword and further include a second data block corresponding to a second LDPC ECC codeword.

5. The data storage device of claim 1, wherein the LDPC decoder includes a data path that is pipelined.

6. The data storage device of claim 5, wherein the data path includes a routing stage, a permutation stage, a computation stage, and a re-ordering stage.

7. The data storage device of claim 1, wherein the LDPC decoder includes a tree sorter configured to determine a first value and a second value associated with each non-zero finite field element among all input transformed variable node to check node (v2c) message vectors.

8. The data storage device of claim 7, wherein the LDPC decoder is further configured to compute a syndrome value based on the first value.

9. The data storage device of claim 7, wherein the LDPC decoder is further configured to store the first value, the second value, and an index value.

10. The data storage device of claim 9, wherein the LDPC decoder is further configured to store the first value, the second value, and the index value during a first decoding iteration associated with a first data block of the interleaved data blocks, and wherein the LDPC decoder is further configured to access the first value, the second value, and the index value during a second decoding iteration associated with the first data block after the first decoding iteration.

11. The data storage device of claim 1, wherein the memory is a non-volatile memory that is monolithically formed in one or more physical levels of arrays of memory cells having an active area disposed above a silicon substrate, and further comprising circuitry associated with operation of the memory cells.

12. A method comprising:
at a data storage device that includes a memory, a data block interleaver, and a low-density parity check (LDPC) decoder, performing:
accessing information stored at the memory to generate data blocks;
interleaving the data blocks by the data block interleaver to generate interleaved data blocks; and
decoding the interleaved data blocks by the LDPC decoder, wherein decoding the interleaved data blocks includes column-parallel pipeline processing the data blocks.

13. The method of claim 12, wherein the LDPC decoder includes p pipeline stages, wherein interleaving the data blocks includes interleaving p data blocks to generate p interleaved data blocks, wherein decoding the interleaved data blocks includes column-parallel pipeline-processing the p interleaved data blocks simultaneously, and wherein p is a positive integer number greater than one.

14. The method of claim 12, wherein the interleaved data blocks include a first data block corresponding to a first LDPC error correcting code (ECC) codeword and further include a second data block corresponding to a second LDPC ECC codeword.

15. The method of claim 12, further comprising determining a first value and a second value associated with each non-zero finite field element among all input transformed variable node to check node (v2c) message vectors.

16. The method of claim 15, further comprising computing a syndrome value based on the first value.

17. The method of claim 12, wherein the data storage device further includes a controller that includes the data block interleaver and the LDPC decoder, and wherein the information is accessed by the controller.

18. An apparatus comprising:
means for accessing information stored at a memory to generate data blocks;
means for interleaving the data blocks to generate interleaved data blocks; and
means for column-parallel pipeline-processing the data blocks at a low-density parity check (LDPC) decoder.

19. The apparatus of claim 18, wherein the means for accessing, the means for interleaving, and the means for column-parallel pipeline-processing are included in a controller of a data storage device.

20. The apparatus of claim 18, further comprising means for determining a first value and a second value associated with each non-zero finite field element among all input transformed variable node to check node (v2c) message vectors.

\* \* \* \* \*